(12) United States Patent
Pellizzer

(10) Patent No.: US 11,043,277 B1
(45) Date of Patent: Jun. 22, 2021

(54) TWO MULTI-LEVEL MEMORY CELLS SENSED TO DETERMINE MULTIPLE DATA VALUES

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/869,109

(22) Filed: May 7, 2020

(51) Int. Cl.
| | | |
|---|---|---|
| *G11C 7/00* | (2006.01) |
| *G11C 16/26* | (2006.01) |
| *G11C 16/12* | (2006.01) |
| *G11C 16/30* | (2006.01) |
| *G11C 16/34* | (2006.01) |

(52) U.S. Cl.
CPC ............ *G11C 16/26* (2013.01); *G11C 16/12* (2013.01); *G11C 16/30* (2013.01); *G11C 16/34* (2013.01)

(58) Field of Classification Search
CPC ......... G11C 7/051; G11C 7/22; G11C 7/1072; G11C 7/1006
USPC ...................................... 365/189.15, 189.14
See application file for complete search history.

(56) References Cited

U.S. PATENT DOCUMENTS

| | | | |
|---|---|---|---|
| 9,117,519 B2 | 8/2015 | Spessot et al. |
| 9,613,695 B2 | 4/2017 | Spessot et al. |
| 10,395,738 B2 | 5/2019 | Castro |
| 10,366,747 B2 | 7/2019 | Castro |
| 10,381,075 B2 | 8/2019 | Totorelli et al. |
| 10,546,632 B2 | 1/2020 | Redaelli et al. |
| 2007/0258297 A1* | 11/2007 | Hung .................. G06F 11/1008 365/200 |
| 2011/0080784 A1* | 4/2011 | Chang .................... G11C 16/10 365/185.03 |

(Continued)

*Primary Examiner* — Son T Dinh
(74) *Attorney, Agent, or Firm* — Brooks, Cameron & Huebsch, PLLC

(57) ABSTRACT

The present disclosure includes apparatuses, methods, and systems for sensing two memory cells to determine multiple data values. An embodiment includes a memory having a plurality of memory cells and circuitry configured to sense memory states of each of two self-selecting multi-level memory cells (MLC) of the plurality of memory cells to determine multiple data values. The data values are determined by sensing a memory state of a first MLC using a first sensing voltage in a sense window between a first threshold voltage distribution corresponding to a first memory state and a second threshold voltage distribution corresponding to a second memory state and sensing a memory state of a second MLC using a second sensing voltage in a sense window between the first threshold voltage distribution corresponding to a first memory state and a second threshold voltage distribution corresponding to the second memory state. The sequence of determining data values includes sensing the memory state of the first and the second MLCs using higher sensing voltages than the first and the second sensing voltages in subsequent sensing windows, in repeated iterations, until the state of the first and the second MLCs are determined. The first and second sensing voltages are selectably closer in the sense window to the first threshold voltage distribution or the second threshold voltage distribution.

20 Claims, 5 Drawing Sheets

(56) References Cited

U.S. PATENT DOCUMENTS

2013/0215687 A1\* 8/2013 Chen ................ G11C 29/42
365/189.11

\* cited by examiner

313

|  | D | D* | Result | Fail |  |
|---|---|---|---|---|---|
| 331 | 00 | 01 | "1" | N.A. | |
| 332 | 01 | 00 | "2" | N.A. | SEMI-RELIABLE STATE |
| 333 | 10 | 11 | "3" | N.A. | |
| 334 | 11 | 10 | "4" | N.A. | SEMI-RELIABLE STATE |
| 335 | 01 | 01 | "1" | D | |
| 336 | 00 | 00 | "1" | D* | |
| 337 | 10 | 00 | "2" | D | |
| 338 | 10 | 10 | "3" | D* | |
| 339 | 11 | 11 | "3" | D | |
| 340 | 11 | 01 | "4" | D* | |
| 341 | 11 | 00 | "5" | N.A. | RELIABLE STATE |
| 342 | 10 | 01 | N.V. | | |
| 343 | 01 | 10 | N.V. | | |
| 344 | 01 | 11 | "6" | D | |
| 345 | 00 | 10 | "6" | D* | |
| 346 | 00 | 11 | "6" | N.A. | |

*FIG. 3B*

TWO MULTI-LEVEL MEMORY CELLS SENSED TO DETERMINE MULTIPLE DATA VALUES

TECHNICAL FIELD

The present disclosure relates generally to semiconductor memory and methods, and more particularly, to two multi-level memory cells sensed to determine multiple data values.

BACKGROUND

Memory devices are typically provided as internal, semiconductor, integrated circuits and/or external removable devices in computers or other electronic devices. There are many different types of memory, including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and/or low power consumption. Non-volatile memory may be used in, for example, personal computers, portable memory sticks, solid state drives (SSDs), digital cameras, cellular telephones, portable music players, such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target memory state by varying the resistance level of the memory element. Resistance variable memory cells can be programmed to a target memory state (e.g., corresponding to a particular resistance state) by applying sources of an electrical field or energy, such as positive or negative electrical pulses (e.g., positive or negative voltage or current pulses) to the memory cells (e.g., to the memory element of the memory cells) for a particular duration. A state of a resistance variable memory cell can be determined by sensing current through the memory cell responsive to an applied interrogation voltage. The sensed current, which varies based on the resistance level of the memory cell, can indicate the state of the memory cell.

Various memory arrays can be organized in a cross-point architecture with memory cells (e.g., resistance variable memory cells) being located at intersections of a first and second signal lines used to access the memory cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can include a single material which can serve as both a select element and a storage element for the memory cell.

BRIEF DESCRIPTION OF THE DRAWINGS

FIG. 3B illustrates an example of a truth table associated with memory states of memory cells for two memory cells being sensed to determine multiple data values, in accordance with an embodiment of the present disclosure.

DETAILED DESCRIPTION

Figure 1:
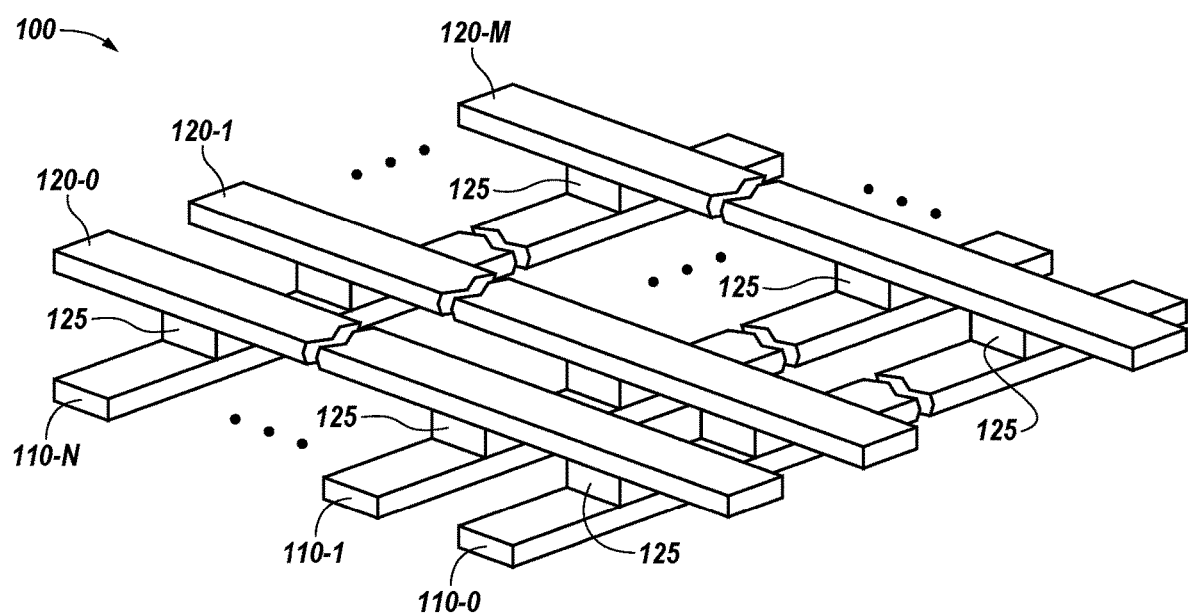
FIG. 1 is a three-dimensional view of an example of a memory array, in accordance with an embodiment of the present disclosure.

The present disclosure includes apparatuses, methods, and systems for sensing two memory cells to determine multiple data values. An embodiment includes a memory having a plurality of memory cells and circuitry configured to sense memory states of each of two self-selecting multi-level memory cells (MLC) of the plurality of memory cells to determine multiple data values. The data values are determined by sensing the memory state of a first sensing a memory state of a first MLC using a first sensing voltage in a sense window between a first threshold voltage distribution corresponding to a first memory state and a second threshold voltage distribution corresponding to a second memory state and sensing a memory state of a second MLC using a second sensing voltage in a sense window between the first threshold voltage distribution corresponding to a first memory state and a second threshold voltage distribution corresponding to the second memory state. The sequence of determining data values includes sensing the memory state of the first and the second MLCs using higher sensing voltages than the first and the second sensing voltages in subsequent sensing windows, in repeated iterations, until the state of the first and the second MLCs are determined. The first sensing voltage and the second sensing voltage are selectably closer in the sense window to the first threshold voltage distribution or the second threshold voltage distribution.

Embodiments of the present disclosure can provide benefits, such as increased reliability and accuracy of data sensing and/or increased speed and reduced complexity of data correction operations, as compared to previous memory devices. For example, previous approaches for programming resistance variable memory cells, such as self-selecting memory cells, may generate one of two different states, such that each of the memory cells can be programmed with multiple data values (e.g., 00, 01, 10 or 11). In such approaches, two sensing voltages may be placed substantially at a median voltage separation in a sense (e.g., read)

window between a first threshold voltage distribution corresponding to a first memory state with multiple data values and a second threshold voltage distribution (e.g., a distribution of stored voltages for a second number of memory cells) corresponding to a second memory state with multiple data values. Each of the threshold voltage distributions may represent separate distributions of stored voltages for a plurality of memory cells and/or a statistical distribution of potential stored voltages for a first memory cell and a paired second memory cell.

A number of data storage and/or programming considerations for various types of memory cells (e.g., resistance variable memory cells, among others), however, may cause stored voltages of a number (e.g., a subset or all) of the memory cells in the threshold voltage distributions to shift and to overlap the single sensing voltage at the median of the sense window such that the sensed voltage relative to the sensing voltage (e.g., the data value) becomes unreliable and/or inaccurate during read operations. Such shifts may, for example, be contributed to by (e.g., result from) at least one of a widening (e.g., over time) threshold voltage distributions to at least overlap the single sensing voltage, a drift (e.g., over time) of threshold voltage distributions to a larger median voltage to at least overlap the single sensing voltage, and/or a disturbance of memory states of subsets of memory cells in the threshold voltage distributions, by performance of read and/or write operations on at least some of the memory cells, to at least overlap the single sensing voltage, among other possible data storage and/or programming considerations.

The embodiments described herein for sensing two memory cells to determine multiple data values by using multiple sensing voltages that are selectably closer in the sense window to various threshold voltage distributions are intended to reduce a potential for some of the stored voltages overlapping the sensing voltages of the respective threshold voltage distributions. As such, these embodiments can increase the reliability and accuracy of data accessed from memory cells. Moreover, as described herein, the embodiments can increase speed and/or reduce complexity of data correction operations for potential data errors that may result, for example, from such shifts in the first and/or second threshold voltage distributions to further increase the reliability and accuracy of the data accessed from memory cells, as compared to previous memory devices. Memory devices may include a plurality of arrays of memory cells of which all of the arrays or a subset (less than all) of the arrays may be configured to store, read, write, and/or perform data validation and correction as described herein.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure. Moreover, numbers separated by a hyphen from a particular reference numeral (e.g., 312-1, 312-2, 312-3 in FIG. 3A for sense windows) are intended to denote similar features, although the position, magnitude, width, height, and/or shape, etc., of such features may vary within and/or between particular embodiments. The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-0 to 120-M that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different memory states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed from various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The example shown in FIG. 1 may include a driver (e.g., a word line driver—not shown) coupled to word line 110. The word line driver may supply bi-polar (e.g., positive and negative) current and/or voltage signals to word line 110. A sense amplifier (e.g., in the sensing circuitry 405 shown in FIG. 4), which may comprise a cross-coupled latch, may be coupled to the word line driver and may detect positive and negative currents and/or positive and negative voltages on word line 110. In some examples, a sense amplifier may be part of (e.g., included in) a word line driver. For example, the word line driver may include the sensing functionality of sense amplifier. In some examples, a sense amplifier may be part of (e.g., included in) the sensing circuitry coupled to the memory cells 125 (e.g., in an array of memory cells, as shown at 406 in FIG. 4). A bit line driver (not shown) may be coupled to bit line 120 to supply positive and/or negative current and/or voltage signals to bit line 120.

The sense amplifier may detect the current and/or voltage associated with one or more memory cells 125 relative to a particular sensing voltage (e.g., threshold) and may output a signal to indicate a particular memory state of each memory cell 125 based on a magnitude of a voltage stored by a particular memory cells relative to the particular sensing voltage. The sensed memory state for each memory cell 125 may be sent to and/or stored by a particular latch (not shown) as expressed in a truth table (e.g., as shown at 313 and described in connection with FIG. 3B), and the sensed memory states value may represent a particular determined outcome of verification of validity of the sensed memory states and/or the need for correction of invalid sensed memory states (e.g., associated with a read operation).

Figure 2A:
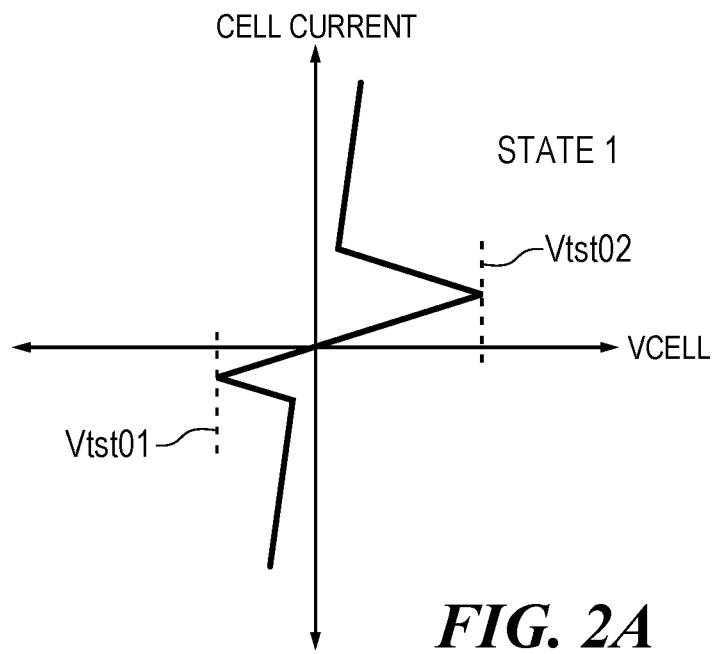
FIG. 2A is an example of a current-versus-voltage curve, in accordance with an embodiment of the present disclosure.
Figure 2B:
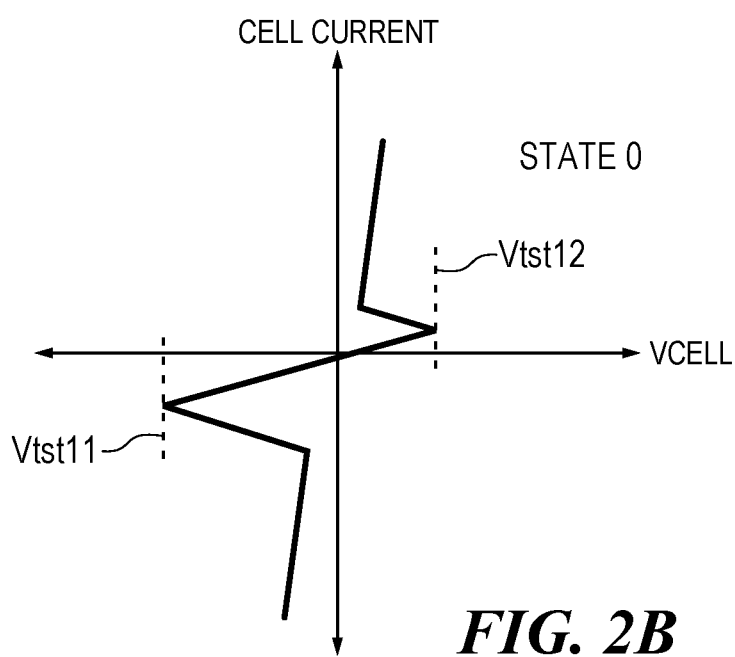
FIG. 2B is another example of sensing threshold voltage distributions associated with memory states of memory cells for two multi-level memory cells being sensed to determine multiple data values, in accordance with another embodiment of the present disclosure.

FIGS. 2A and 2B illustrate memory cell snapback as described herein. VCELL can represent an applied voltage across the memory cell. For example, VCELL can be a voltage applied to a top electrode corresponding to the memory cell minus a voltage applied to a bottom electrode corresponding to the memory cell (e.g., via a respective word line and bit line). As shown in FIG. 2A, responsive to an applied positive polarity voltage (VCELL), a memory cell programmed to memory state 1 (e.g., in a threshold voltage distribution) is in a non-conductive state until VCELL reaches voltage Vtst02, at which point the memory cell transitions to a conductive (e.g., lower resistance) state. This transition can be referred to as a snapback event, which occurs when the voltage applied across the memory cell (in a particular polarity) exceeds the memory cell's threshold voltage. Accordingly, voltage Vtst02 can be referred to as a snapback voltage. In FIG. 2A, voltage Vtst01 corresponds to a snapback voltage for a memory cell programmed to memory state 1 (e.g., in another threshold voltage distribution). That is, as shown in FIG. 2A, the memory cell transitions (e.g., switches) to a conductive state when VCELL exceeds Vtst01 in the negative polarity direction.

Similarly, as shown in FIG. 2B, responsive to an applied negative polarity voltage (VCELL), a memory cell programmed to memory state 0 (e.g., in a threshold voltage distribution) is in a non-conductive state until VCELL reaches voltage Vtst11, at which point the memory cell snaps back to a conductive (e.g., lower resistance) state. In FIG. 2B, voltage Vtst12 corresponds to the snapback voltage for a memory cell programmed to memory state 0 (e.g., in another threshold voltage distribution). That is, the memory cell snaps back from a high impedance non-conductive state to a lower impedance conductive state when VCELL exceeds Vtst12 in the positive polarity direction.

In various instances, a snapback event can result in a memory cell switching memory states. For instance, if a VCELL exceeding Vtst02 is applied to a memory cell in memory state 1, the resulting snapback event may reduce the threshold voltage of the memory cell to a level below a respective sensing voltage, as described herein, which would result in the memory cell being sensed (read) as memory state 0 rather than memory state 1. As such, in a number of embodiments, a snapback event can switch a memory cell to the opposite state (e.g., from memory state 1 to memory state 0 and vice versa), as described in connection with FIG. 3A.

Figure 3A:
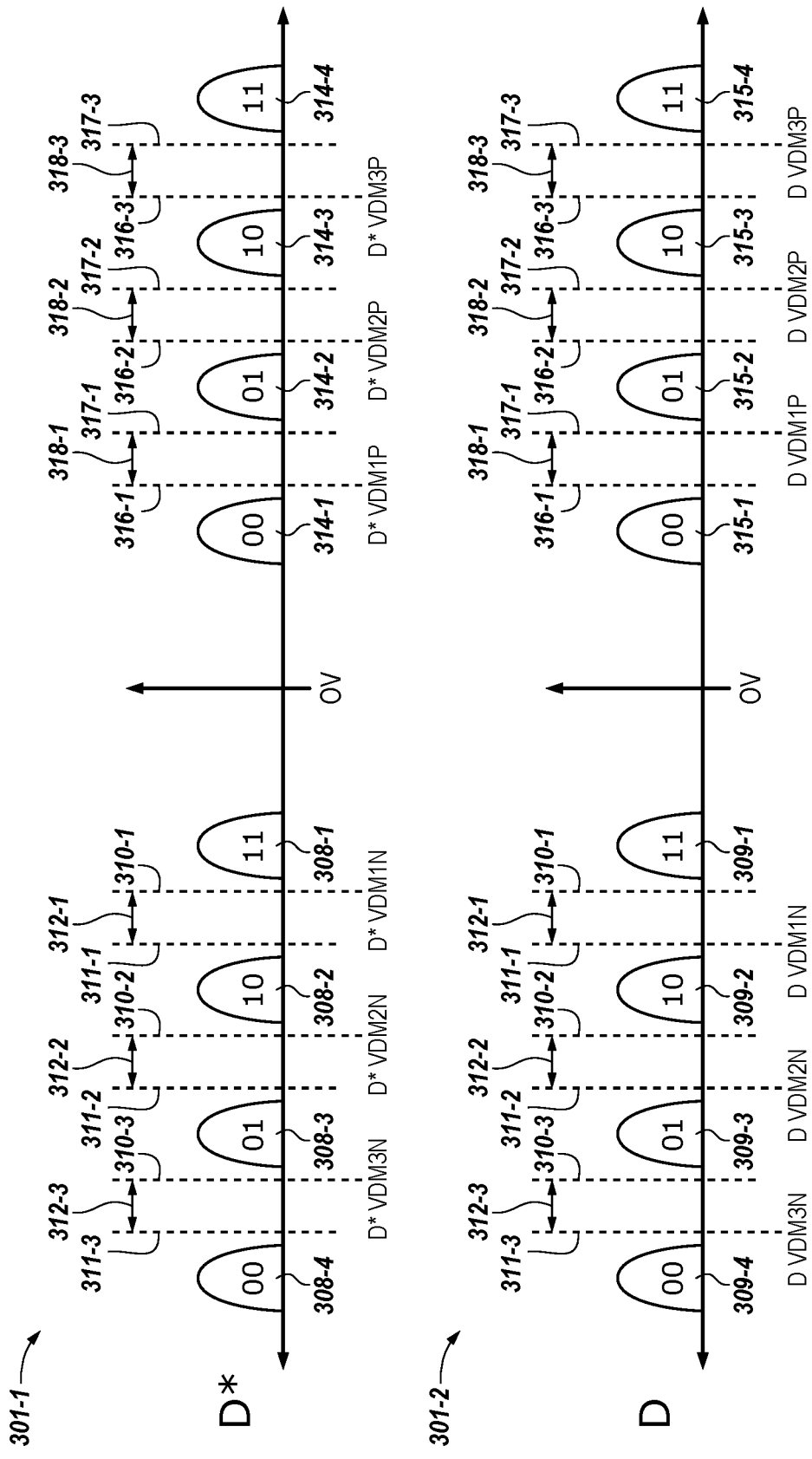
FIG. 3A illustrates an example of sensing threshold voltage distributions associated with memory states of memory cells for two memory cells being sensed to determine multiple data values, in accordance with an embodiment of the present disclosure.

FIG. 3A illustrates an example of sensing threshold voltage distributions associated with memory states of memory cells for two multi-level memory cells (MLCs) being sensed to determine multiple data values, in accordance with an embodiment of the present disclosure.

The example shown in FIG. 3A illustrates four threshold voltage distributions 308-1, 308-2, 308-3, and 308-4, representing four bits, associated with the memory states of a first one of a pair of MLCs, e.g., a first MLC memory cell 301-1, and four threshold voltage distributions 309-1, 309-2, 309-3, and 309-4, associated with the memory states of a second one of the pair of MLCs, e.g., a second MLC memory cell 301-2, in a negative polarity orientation. The memory cell 301-1 shown comprise 2 bits. Each bit has 2 values and the combinations of data values may produce 4 memory states. The second memory cell 301-2 may also comprise 2 bits. Two memory cells, 301-1 and 301-2 respectively, that may operate as a pair of memory cells to each store a voltage magnitude that, when sensed and compared, enable determination of multiple data values. Memory cell 301-1 represents one of a pair of such memory cells, where each of the memory cells is configured to selectably store a voltage magnitude (e.g., relative to zero volts (0V)) corresponding to four memory states as determined by reference to a determined (e.g., predetermined) sensing voltage in a sense window. In the example embodiment of FIG. 3A, three (3) sense windows 312-1, 312-2, and 312-3 are shown between four memory states. For example, sense window 312-1 is shown between threshold voltage distribution 308-1 (data value 11) and threshold voltage distribution 308-2 (data value 10). Sense window 312-2 is shown between threshold voltage distribution 308-2 (data value 10) and threshold voltage distribution 308-3 (data value 01). Sense window 312-3 is shown between threshold voltage distribution 308-3 (data value 01) and threshold voltage distribution 308-4 (data value 00). When the threshold voltage distributions have not shifted relative to (e.g., are not overlapping) one or both of their determined sensing voltages, each corresponds to two of the four data values.

In the example of FIG. 3A, six (6) sensing voltages are shown associated with the three sense windows, two for each sense window. For example, sensing voltages 310-1 (D*VDM1N) and 311-1 (D VDM1N) are associated with sense window 312-1. Sensing voltages 310-2 and 311-2 are associated with sense window 312-2. Sensing voltages 310-3 and 311-3 are associated with sense window 312-3. The memory cells may be determined to have switched memory states due to a shift in a threshold voltage distribution relative to a magnitude of the sensing voltage closest to the threshold voltage distribution in the sense window. For example, memory cell 301-1 may be determined to have switched memory states due to a shift in the first threshold voltage distribution 308-1 relative to a magnitude of the first sensing voltage 310-1 (D*VDM1N) in the sense window 312-1.

The first memory cell 301-1 may be programmed to a data value represented by the threshold voltage distribution 308-1 having a data value state (11) while the second memory cell 301-2 may be programmed to a data value represented by the threshold voltage distribution 309-2 having a data value (10). In order to read the data values of the first memory cell 301-1 a first sensing voltage 310-1 may be applied in a sense window 312-1 between a first threshold voltage distribution 308-1 corresponding to a first data value (11) and a second threshold voltage distribution 308-2 corresponding to a second data value (10). To read the memory states of the second memory cell 301-2, a second sensing voltage 311-1 (D VDM1N) may be applied in a sense window 312-1 between a first threshold voltage distribution 309-1 corresponding to a first data value (11) of the second memory cell 301-2 and a second threshold voltage distribution 309-2 corresponding to a second data value (10) of the second memory cell 301-2.

In this embodiment, the first sensing voltage 310-1 (D*VDM1N) and the second sensing voltage 311-1 (D VDM1N) are selectably closer (e.g., while having a statistically appropriate separation margin) in the sense window 312-1 to the first threshold voltage distribution 308-1 or the second threshold voltage distribution 308-2 of the first memory cell 301-1 and the first and second threshold voltage distribution, 309-1 and 309-2, of the second memory cell 301-2. For example, as illustrated in FIG. 3A, first sensing voltage 310-1 (D*VDM1N) applied to the first and second memory cells, 301-1 and 301-2, is closer (e.g., while having a statistically appropriate separation margin) to first threshold voltage distribution 308-1 or 309-1 in sense window 312-1, respectively. The second sensing voltage 311-1 (D VDM1N) is closer (e.g., while having a statistically appropriate separation margin) to the second threshold voltage distribution 308-2 or 309-2 in sense window 312-1, respectively. A sensing voltage determines a reliability of a threshold voltage distribution. In some embodiments, the memory cells may be read from the lower sensing voltage to the highest sensing voltage. That is, first sensing voltage may have a lesser, absolute value, voltage magnitude than the second sensing voltage in the negative or positive polarity.

To sense the memory state of the first memory cell 301-1 a third sensing voltage 310-2 is applied in a sense window 312-2 between the second threshold voltage distribution 308-2 corresponding to the second memory state (10) and a third threshold voltage distribution 308-3 corresponding to a third memory state (01). A memory state of the second memory cell 301-2 may be sensed (e.g., read) by applying a fourth sensing voltage 311-2 in the sense window 312-2 between the second threshold voltage distribution 309-2 corresponding to the second memory state (10) and a third threshold voltage distribution 309-3 corresponding to the third memory state (01). In this embodiment, the third sensing voltage 310-2 and the fourth sensing voltage 311-2 are selectably closer in the sense window 312-2 to the second threshold voltage distribution 308-2 or the third threshold voltage distribution 309-3. For example as illustrated in FIG. 3A, third sensing voltage 310-2 is closer to second threshold voltage distribution 308-2 in the first memory cell 301-1 in sense window 312-2 while fourth sensing voltage 311-2 is closer to the third threshold voltage distribution 309-3 in sense window 312-2 in the second memory cell 301-2.

Lastly, a fifth sensing voltage 310-3 may be applied to sense the memory state of the first memory cell 301-1 in a sense window 312-3 between the third threshold voltage distribution 308-3 corresponding to the third memory state (01) and a fourth threshold voltage distribution 308-4 corresponding to a fourth memory state (00). The memory state of the second memory cell 301-2 may be sensed using a sixth sensing voltage 311-3 in the sense window 312-3 between the third threshold voltage distribution 309-3 corresponding to the third memory state (01) and a fourth threshold voltage distribution 309-4 corresponding to the fourth memory state (00). In this embodiment, the fifth sensing voltage 310-3 and the sixth sensing voltage 311-3 are selectably closer in the sense window 312-3 to the third threshold voltage distribution 308-3 or the fourth threshold voltage distribution 309-4, respectively. For example as illustrated in FIG. 3A, fifth sensing voltage 310-3 is closer to third threshold voltage distribution 308-3 in the first memory cell 301-1 in sense window 312-3 while sixth sensing voltage 311-3 is closer to the fourth threshold voltage distribution 309-4 in sense window 312-3 in the second memory cell 301-2. Although, memory cell 301-1 and memory cell 301-2 are described and illustrated in detail in a negative polarity, embodiments are not so limited. Memory cell 301-1 and memory cell 301-2 may be similarly read in a positive polarity.

The circuitry may be configured to determine data values ("states"), by comparing the sensed memory states of each of the two multi-level memory cells, validating (e.g., determining "valid" states for a pair of multilevel cells (MLCs shown in FIG. 3B) a memory state of memory cell 301-1 by determining that the sensed data value state is sensed as programmed, and determining a switch in a memory state of the two memory cells (e.g., either of memory cells 301-1 or 301-2) based at least in part on one combination of the two memory states that are sensed (e.g., read) being more readably reliable than another corresponding combination of the two sensed memory states. The reliability may be due to a magnitude of separation of at least one sensing voltage from one threshold voltage distribution on one side of a sensing window, e.g., 312-1, 312-2, 312-3, being nearer or farther apart than a separation of the at least one sensing voltage from the other threshold voltage distribution of the other memory state.

As presented in the example of FIG. 3A, the six (6) sensing voltages with reference numerals 310 and 311 may be used to determine the memory states of a corresponding pair of multilevel memory cells (e.g., to distinguish between memory states as part of a read operation). Determining the reliability and/or accuracy of the data values may depend on an ability to distinguish, for example, data value state (10), corresponding to threshold voltage distribution 308-2, for first memory cell 301-1 from data value state (11), corresponding to threshold voltage distribution 308-1, for first memory cell 301-1 and also from data value state (10), corresponding to threshold voltage distribution 309-2, for second memory cell 301-2 from data value state (11), corresponding to threshold voltage distribution 309-1, for second memory cell 301-2.

A determination that the one combination of sensed memory states is more readably reliable may be based on the greater magnitude of the separation, thereby having a corresponding greater shift to reach the sensing voltage being less probable than a shift resulting from a lesser separation in the other combination of sensed memory states. Accordingly, as shown in FIG. 3A, sensing voltage 310-1 (D*VDM1N) is used for memory cell 301-1 and is at a greater separation from threshold voltage distribution 308-2, having a data value of 10, than the separation of sensing voltage 310-1 (D*VDM1N) from threshold voltage distribution 308-1, having a data value of 11. In addition, sensing voltage 311-1 (D VDM1N) is used for memory cell 301-2 and is at a greater separation from threshold voltage distribution 309-1, having a data value of 11, than the separation of sensing voltage 311-1 (D VDM1N) is from threshold voltage distribution 309-2, having a data value of 10.

As used herein, being readably reliable is intended to mean the sensed memory states being more reliable than, for example as shown in FIG. 3A, threshold voltage distribution 308-1, having a data value of 11, using sensing voltage 310-1 (D*VDM1N) for memory cell 301-1 and sensing of threshold voltage distribution 309-2, having a data value of 10, using sensing voltage 311-1 (D VDM1N) for the intended memory cell 301-2.

The present disclosure further describes the ability, in some instances, to determine which of two memory cells (e.g., memory cells 301-1 or 301-2) has switched their memory state due to a shift in at least a portion of a threshold voltage distribution (e.g., a shift in magnitude of voltage stored by at least some of the memory cells in the distribution) relative to a magnitude of a sensing voltage (e.g., sensing voltages 310-1 (D*VDM1N) and 311-1 (D VDM1N)) in the sense window 312-1. According to embodiments described in further detail in connection with the "truth table" shown in FIG. 3B, sensing voltages 310-2, 311-2, 310-3, and 311-3 may be stepped through, from a lowest, absolute value, voltage magnitude (for negative or positive polarity) to compare sensed memory states in each of a pair of multi-level memory cells (MLCs), e.g., 301-1 and 301-2, using the various sensing voltages, 310-1, 311-1, . . . , 310-3, and 311-3. As shown in FIG. 3A, a magnitude of a first sensing voltage (e.g., 310-1 (D*VDM1N)) may be selectably closer to a first threshold voltage distribution (e.g., 308-1) than to a second threshold voltage distribution (e.g., 308-2) in the sense window 312-1.

Although, memory cell 301-1 and memory cell 301-2 are described and illustrated in detail in a negative polarity, embodiments are not so limited. Memory cell 301-1 and memory cell 301-2 may be similarly read in a positive polarity. In some embodiments, the memory cells may be read from the lower sensing voltage to the highest sensing voltage. That is, first sensing voltage may have a lesser, absolute value, voltage magnitude than the second sensing voltage in the negative or positive polarity. The positive polarity in memory cells 301-1 and 301-2 may still be read from the lower threshold voltage distribution to the highest threshold voltage distribution (that is, from 314-1 to 314-4 and 315-1 to 315-4). As such, memory cell 301-1 may be read from the lower threshold voltage distribution to the highest threshold voltage distribution, from 308-1 to 308-4 in the negative polarity and from 314-1 to 314-4 in the positive polarity. Similarly, memory cell 301-2 may be read from the lower threshold voltage distribution to the highest threshold voltage distribution, as well, from 309-1 to 309-4 in the negative polarity and from 315-1 to 315-4 in the positive polarity.

As presented in the example of FIG. 3A, the six (6) sensing voltages in the positive polarity with reference numerals, 316-1, 317-1, 316-2, 317-2, 316-3, and 317-3 may be used in three (3) distinct sensing windows, 318-1, 318-2, and 318-3, to determine the memory states of a corresponding pair of multilevel memory cells (e.g., to distinguish between memory states as part of a read operation). Determining the reliability and/or accuracy of the data values may depend on an ability to distinguish, for example, data value state (01), corresponding to threshold voltage distribution 314-2, for first memory cell 301-1 in the positive polarity from data value state (00), corresponding to threshold voltage distribution 314-1, for first memory cell 301-1 in the positive polarity and also from data value state (01), corresponding to threshold voltage distribution 315-2, for second memory cell 301-2 in the positive polarity from data value state (00), corresponding to threshold voltage distribution 315-1, for second memory cell 301-2 in the positive polarity.

A determination that the one combination of sensed memory states is more readably reliable may be based on the greater magnitude of the separation, thereby having a corresponding greater shift to reach the sensing voltage being less probable than a shift resulting from a lesser separation in the other combination of sensed memory states. Accordingly, as shown in FIG. 3A, sensing voltage 316-1 (D*VDM1P) is used for memory cell 301-1 in the positive polarity and is at a greater separation from threshold voltage distribution 314-2, having a data value of 01, than the separation of sensing voltage 316-1 (D*VDM1P) from threshold voltage distribution 314-1, having a data value of 00. In addition, sensing voltage 317-1 (D VDM1P) is used for memory cell 301-2 and is at a greater separation from threshold voltage distribution 315-1, having a data value of 00, than the separation of sensing voltage 317-1 (D VDM1P) is from threshold voltage distribution 315-2, having a data value of 01.

As used herein, being readably reliable is intended to mean the sensed memory states being more reliable than, for example as shown in FIG. 3A, threshold voltage distribution 314-1, having a data value of 00, using sensing voltage 316-1 (D*VDM1P) for memory cell 301-1 in the positive polarity and sensing of threshold voltage distribution 315-2, having a data value of 01, using sensing voltage 317-1 (D VDM1P) for the intended memory cell 301-2 in the positive polarity.

The present disclosure further describes the ability, in some instances, to determine which of two memory cells (e.g., memory cells 301-1 or 301-2) has switched their memory state due to a shift in at least a portion of a threshold voltage distribution (e.g., a shift in magnitude of voltage stored by at least some of the memory cells in the distribution) relative to a magnitude of a sensing voltage in the positive polarity (e.g., sensing voltages 316-1 (D*VDM1P) and 317-1 (D VDM1P)) in the sense window 318-1. According to embodiments described in further detail in connection with the "truth table" shown in FIG. 3B, sensing voltages 316-2, 317-2, 316-3, and 317-3 may be stepped through, from a lowest, absolute value, voltage magnitude (for negative or positive polarity) to compare sensed memory states in each of a pair of multi-level memory cells (MLCs), e.g., 301-1 and 301-2, using the various sensing voltages, 316-1, 317-1, . . . , 316-3, and 317-3. As shown in FIG. 3A, a magnitude of a first sensing voltage (e.g., 316-1 (D*VDM1P)) may be selectably closer to a first threshold voltage distribution (e.g., 314-1) than to a second threshold voltage distribution (e.g., 314-2) in the sense window 318-1.

FIG. 3B illustrates an example of a truth associated with data value states of memory cells for two multi-level memory cells (MLCs) being sensed to determine multiple data values, in accordance with various embodiments of the present disclosure. FIG. 3B illustrates a truth table associated with various memory states of memory cells, such as memory cells 301 illustrated in FIG. 3A.

Reference to the truth table 313 enables comparison of a sensed memory state of a first memory cell (e.g., memory cell 301-1) to a sensed memory state of a second memory cell (e.g., memory cell 301-2), determination of a switch in the memory state due to the shift by determination that the sensed memory states match (e.g., both memory states being duplicated) or are not readably reliable, and determination of which of the two memory cells has switched. Switching from one memory state to another memory state is intended to mean that the two memory cells originally stored programed memory states and one of the memory cells switched (changed) its memory state, e.g., due to drift in a threshold voltage distribution. As shown by the truth table this may be indicated by the fact that the two read memory states of the two memory cells match (e.g., a data value of 10 in one memory cell and a data value of 10 in the other memory cell), or based on an inability to reliably read combined memory states together in the pair of MLCs. In instances shown in the truth table 313 of FIG. 3B where it is possible to discern which of the two MLCs switched, then responsive to the determination of which of the two memory cells has switched from the one memory state to the other memory state (e.g., in reference to the truth table 313) the circuitry is configured to reprogram the memory cell that has switched back to a correct memory state. The truth table 313 may be referenced to enable a determination of which of the two memory cells has switched their memory state, and in response, circuitry may be used for reprogramming the memory cell that has switched its data values back to its original data value.

The determination of which of the two memory cells has switched from one memory state to another memory state is based at least in part on one combination of the two memory states being more readably reliable than another combination of the two memory states. For example, as shown in row 333 of the truth table of FIG. 3B, sensing the memory state 308-1, having a data value of 11 in the first memory cell 301-1 using the first sensing voltage 310-1 (D*VDM1N), and sensing the memory state 309-2, having a data value of 10 in the second memory cell 301-2 using the second sensing voltage 311-1 (D VDM1N) is more readably reliable (e.g., expressed as resultant valid state "3"). The reliability is due to a magnitude of separation of sensing voltage 310-1 (D*VDM1N) from the threshold voltage distribution 308-2 of memory cell 301-1 being greater than a separation of sensing voltage 310-1 (D*VDM1N) from the threshold voltage distribution 308-1 of memory cell 301-1. The reliability is further due to a magnitude of separation of sensing voltage 311-1 (D VDM1N) from the threshold voltage distribution 309-1 of memory cell 301-2 being greater than a separation of sensing voltage 311-1 (D VDM1N) from the threshold voltage distribution 309-2 of memory cell 301-2. It is noted that serially stepping through the sensing voltages 310-1 (D*VDM1N), 311-1 (D VDM1N), 310-2 (D*VDM2N), 311-2 (D VDM2N), 310-3 (D*VDM3N), and 311-3 (D VDM3N) it is only upon application of the fourth sensing voltage 311-2 (D VDM2N) that memory state 309-2, having a data value 10 in the second memory cell 301-2 will be detected (e.g., read). The process described herein is carried forward for each possible memory state combination with the results expressed in the truth table 313 of FIG. 3B. Similarly, if the sensing voltages applied to each memory cell 301-1 and 301-2 sense a result of data value 11 in the second memory cell 301-2 and a result of a data value 10 in the first memory cell (e.g., the inverse to the result shown in row 333) as indicated in reference to row 334 in the truth table 313, then this resultant state (e.g., valid state "4") may also be readably reliable. Additionally, as shown in row 339, if the results of the applied sensing voltages, 310-1, 311-1, 310-2, 311-2 result in a determination that memory cell 301-1 is in a memory state reflected by data value 11 and that memory cell 301-2 is also in a memory state reflected by data value 11 then it is determined that the memory cell 301-2 has switched state. And as a further example, as shown in row 338, if the results of the applied sensing voltages, 310-1, 311-1, 310-2, 311-2 result in a determination that memory cell 301-1 is in a memory state reflected by data value 10 and that memory cell 301-2 is also in a memory state reflected by data value 10 then it is determined that the memory cell 301-1 has switched state.

A switch in a memory state of a given memory cell may, in the first example above, be due to a shift in a second threshold voltage distribution (e.g., 309-2) relative to a magnitude of the second sensing voltage (e.g., 311-1 (D VDM1N)) in the sense window 312-1 rather than to the magnitude of the first sensing voltage (e.g., 310-1 (D*VDM1N)) because of the lesser separation from the second sensing voltage (e.g., 311-1 (D VDM1N)) relative to the first sensing voltage (e.g., 310-1 (D*VDM1N)). Because there is a low probability of two paired memory cells switching memory states due to a shift at the same point in time, determining which of the two memory cells has switched their memory state at that point in time may enable prompt correction of the switched memory state back to the original memory state (e.g., before the other memory cell potentially switches memory states) to improve reliability and/or accuracy of stored data.

As used herein, a lesser reliability is intended to mean that another combination of the four data values between the two memory cells are less readably reliable due to a first magnitude of separation of a sensing voltage from a given threshold voltage distribution representing a memory state and a second magnitude of separation of a second sensing voltage from another threshold voltage distribution representing another being less than separations of sensing voltages from the respective distributions other memory states in more readably reliable combinations, or that it is not discernable that both threshold voltage distributions have not both shifted.

There is a low probability that the same factor would affect the reliability of the two memory states for the two memory cells at the same time, which contributes to a low probability of two paired memory cells switching memory states at the same point in time. For example, a drift of the first threshold voltage distribution 308-1 to a first larger, absolute value, median magnitude may result in at least one memory cell overlapping the closer first sensing voltage 310-1 (D*VDM1N) because the drift would be toward the closer first sensing voltage 310-1 (D*VDM1N). In contrast, a drift of the second threshold voltage distribution 308-2 to a second larger, absolute value, median magnitude would not result in any memory cells overlapping the closer second sensing voltage 311-2 (D VDM2N) because the required drift would be greater and the second threshold voltage distribution 308-2 is farther away from the fourth sensing voltage 311-2 (D VDM2N). However, as noted, as this process is carried out across all sensing voltages 310-1 (D*VDM1N), 311-1 (D VDM1N), 310-2 (D*VDM2N), 311-2 (D VDM2N), 310-3 (D*VDM3N), and 311-3 (D VDM3N) for all memory states 308-1, 308-2, 308-3, and 308-4 in memory cell 301-1 and memory states 309-1, 309-2, 309-3, and 309-4 in memory cell 301-2 it may not always be discernable that both threshold voltage distributions have not both shifted.

Various factors may contribute to a switch of a memory state due to a shift in at least a portion of a threshold voltage distribution. For example, the shift may be contributed to by at least one of: a widening of the first threshold voltage distribution (e.g., 308-1, 309-1) for a first subset of memory cells to at least overlap the first sensing voltage (e.g., 310-1 (D*VDM1N)); a widening of the second threshold voltage distribution (e.g., 308-2, 309-2) for a second subset of memory cells to at least overlap the third sensing voltage (e.g., 310-2 (D*VDM2N)). The same may occur for each of the threshold voltage distributions 308-1, 308-2, 308-3, and 308-4 in memory cell 301-1 and threshold voltage distributions 309-1, 309-2, 309-3, and 309-4 in memory cell 301-2 relative to the other sensing voltages 311-2 (D VDM2N), 310-3 (D*VDM3N), and 311-3 (D VDM3N). Shift may also be contributed to by a drift of the threshold voltage distributions in the memory cells to a larger median magnitude of the polarity to at least overlap the sensing voltages; a disturbance of the memory states of the memory cells by performance of read or write operations on at least some of the memory cells such that a given threshold voltage distribution at least overlaps a sensing voltage; among other possible contributors to shifting a threshold voltage distribution.

The determination of which of the two memory cells has switched is further based at least in part on the circuitry being configured to use the information depicted the truth table 313, responsive to the determination that the two data values corresponding to two corresponding memory states match or are less readably reliable, and to use the more readably reliable combination of the two memory states for a first memory cell 301-1 and a second memory cell 301-2 of the two memory cells as a stable combination based on being less probable to switch. The readably reliability of the two data values are validated based on a determination that no SWITCH is likely to occur, as indicated in the truth table 313 by N/A.

The truth table 313 may indicate one cell or the other as the less readably reliable member of the data value pair for the first memory cell 301-1 ("D*") and the second memory cell 301-2 ("D"). For example, a particular combination may provide insight as to which cell has switched based on being more probable to switch. Because the unreliableness of the combination of the data values, it may be determined that the data may have switched memory states in either the first or the second memory cell 301-1 or 301-2, as indicated in the truth table 313 by the sensing voltage (D or D*) closest to the threshold voltage distribution. The truth table 313 may be further used to compare the valid data values ("valid states") sensed from the first memory cell 301-1 (D*) and the second memory cell (D) to the less readably reliable data values read of the two memory states for the first and second memory cells, 301-1 (D*) and 301-2 (D) to determine which of the first or the second memory cells 301-1 (D*) and 301-2 (D) has switched.

As shown in the truth table 313, applying the sensing voltages, 310-1 (D*VDM1N), 311-1 (D VDM1N), 310-2 (D*VDM2N), 311-2 (D VDM2N), 310-3 (D*VDM3N), and 311-3 (D VDM3N) in sequence from lowest absolute voltage to highest absolute voltage to the first memory cell 301-1 (D* in column 2 of the truth table 313) and the second memory cell 301-2 (D in column 1 of the truth table 313) will result in at least six (6) reliable states ("valid states") readable between the two MLCs. These are represented as states "1", "2", "3", "4", "5", and "6" in the third column of the truth table 313 (in the column labeled "Result"), and the at least six (6) reliable states, e.g., valid states, are reflected with the designation "N.A." in the fourth column of the truth table 313 for "not applicable" in the column labeled "Fail".

As a beginning example of operation using the sensing methodology described herein, as the sensing voltages 310-1 (D*VDM1N), 311-1 (D VDM1N), 310-2 (D*VDM2N), 311-2 (D VDM2N), 310-3 (D*VDM3N), and 311-3 (D VDM3N) are stepped through right to left in reference to the negative polarity from the zero (0) Volt vertical axis in respective absolute magnitude the following can be determined. As the sensing voltages 310 and 311 are applied to the first (D*) and second (D) memory cell 301-1 and 301-2, a sensed state having a data value of 10, for the second memory cell 301-2 (to which D VDM1N, D VDM2N, and D VDM3N sensing voltages are applied) and a sensed state having a data value of 11, for the first memory cell 301-1 (to which D*VDM1N, D*VDM2N, and D* VDM3N sensing voltages are applied) is a more readably reliable combination (e.g., based on being stable and less probable to switch), as shown in row 333 in the truth table 313 (e.g., as valid state "3" with an N.A. in the fail column). An inverse pair of sensed states having a data value of 11, for the second memory cell 301-2 and a sensed state having a data value of 10, for the first memory cell 301-1 is also a more readably reliable combination, as shown in row 334 in the truth table 313 (e.g., as valid state "4" with an N.A. in the fail column).

As shown within the truth table 313, an example of a less readably reliable combination of sensed (e.g., read) states may include the combination of sensed data values producing a data value of 11, for memory cell 301-2 and a sensed data value of 11, for the first memory cell 301-1. Based on the described technique of placing the sensing voltages 310-1 (D*VDM1N), 311-1 (D VDM1N), 310-2 (D*VDM2N), 311-2 (D VDM2N), 310-3 (D*VDM3N), and 311-3 (D VDM3N) at opposing ends of the respective sensing windows 312-1, 312-2, and 312-3, this resultant match of data value states is a less readably reliable combination (e.g., based on the likelihood of the second memory cell 301-2 (D) to have switched), as shown in row 339 in the truth table 313. This is based on reading the reliable state as state 11 (state "3" of the third column) of the first memory cell 301-1 (D*) for the proximity of the sensing voltage 310-1 (D*VDM1N) in sensing window 312-1 being closer to the first threshold voltage distribution of 308-1 in memory cell 301-1. As a result, the second memory cell 301-2 (D) is reflected in the fourth column (under the "Fail") as the cell that has switched state (e.g., "flipped") and can be reprogrammed back to a correct programmed state in threshold voltage distribution 309-2 having the data value 10. For similar reasoning, sensed data values producing a data value of 11, for memory cell 301-2 and a sensed data value of 01, for memory cell 301-1 is also a less readably reliable combination, as shown in row 340 in the truth table 313.

Another less reliable sensed data values combination, between memory cell 301-1 and memory cell 301-2, is shown in row 344 in the truth table 313. This example, includes the sensed data values of a data value of 01 for the second memory cell 301-2 and a sensed data value of 11 for first memory cell 301-1. This combination too, based on the sensing voltage methodology described herein, and is a less readably reliable combination, expressed as state "6" as shown in row 344 in the truth table 313. This is based on reading the reliable state as state 11 (state "6" of the third column) of the first memory cell 301-1 (D*) for the proximity of the sensing voltage 310-1 (D*VDM1N) in sensing window 312-1 being closer to the first threshold voltage distribution of 308-1 in memory cell 301-1. As a result, the second memory cell 301-2 (D) is reflected in the fourth column (under the "Fail") as the cell that has switched state (e.g., "flipped") and can be reprogrammed back to a correct programmed state in threshold voltage distribution 309-4 having the data value 00 since the sensing voltage D VDM3N is in closer proximity on the end of sensing window 312-3.

Continuing with the example expressed in the truth table 313 of FIG. 3B, applying the sensing voltages 310-1 (D*VDM1N), 311-1 (D VDM1N), 310-2 (D*VDM2N), 311-2 (D VDM2N), 310-3 (D*VDM3N), and 311-3 (D VDM3N) at opposing ends of the respective sensing windows 312-1, 312-2, and 312-3 to a pair of MLCs 301-1 and 301-2 under this methodology, and reading sensed states having a data value of 00 for memory cell 301-2 and having a data value of 11 for memory cell 301-1 is determined to be a more readably reliable combination, as shown in row 346 (as state "6") in the truth table 313 (N.A. listed under the fourth, "Fail" column representing a valid state). Again, the proximity of sensing voltage 310-1 (D*VDM1N) to threshold voltage distribution 308-1 for memory cell 301-1 in sensing window 312-1 and the proximity of sensing voltage 311-3 (D VDM3N) to threshold voltage distribution 309-4 for memory cell 301-2 in sensing window 312-3 produces the high likelihood of a valid state read. Similarly, sensed data values according to this disclosed methodology having a data value of 11 for memory cell 301-2 and having a data value of 00 for memory cell 301-1 is also a more readably reliable combination, as shown in row 341 (state "5") in the truth table 313 (N.A. listed under the fourth, "Fail" column representing a valid state).

As shown within the truth table 313 in row 338, another example of a less readably reliable combination of sensed (e.g., read) states may include the sensed data values of 10 for the second memory cell 301-2, and a sensed data value of 10 for first memory cell 301-1. This combination too, based on the sensing voltage methodology described herein, and is a less readably reliable combination, expressed as state "3" as shown in row 338 in the truth table 313. This is based on reading the reliable state as state 10 (state "3" of the third column) of the second memory cell 301-2 (D) for the proximity of the sensing voltage 311-1 (D VDM1N) in sensing window 312-1 being closer to the second threshold voltage distribution of 309-2 in memory cell 301-2. As a result, the first memory cell 301-1 (D*) is reflected in the fourth column (under the "Fail") as the cell that has switched state (e.g., "flipped") and can be reprogrammed back to a correct programmed state in threshold voltage distribution 308-1 having the data value 11 since the sensing voltage D*VDM1N is in closer proximity on the end of sensing window 312-1.

There may be sensed data combinations that may be unverified. For example, the combination of sensed data value of 01, for memory cell 301-2 and send data value of 10, for memory cell 301-1 may be an unverified combination, as shown in row 343 in the truth table 313. The proximity of sensing voltage 310-2 (D*VDM2N) to threshold voltage distribution 308-2 for memory cell 301-1 in sensing window 312-2 and the proximity of sensing voltage 311-2 (D VDM2N) to threshold voltage distribution 309-3 for memory cell 301-2 in sensing window 312-2 produces the high likelihood of a valid state read. However this combination does not produce a reliable combination of sensed data values and it is uncertain which cell (301-1 or 301-2) switched states. As such, the third column is labeled as N.V. ("not valid") and the fourth/"fail column" is left blank. Likewise the combination of sensed data value 10, for memory cell 301-2 and sensed data value of 01, for memory cell 301-1 may also be a may be unverified combination, as shown in row 342 in the truth table 313. The proximity of sensing voltage 310-2 (D*VDM2N) to threshold voltage distribution 308-3 for memory cell 301-1 in sensing window 312-2 and the proximity of sensing voltage 311-2 (D VDM2N) to threshold voltage distribution 309-2 for memory cell 301-2 in sensing window 312-2 produces the high likelihood of an "invalid" state read for either of the MLCs 301-1 and 301-2 being sensed. Thus, this combination does not produce a reliable combination of sensed data values and it is uncertain which cell 301-1 or 301-2 switched states. As such, the third column is labeled as N.V. ("not valid") and the fourth/"fail column" is left blank.

Pairing the combination having sensed data values of 00, for memory cell 301-2 and sensed data values of 10, for memory cell 301-1 is a less readably reliable combination, as shown in row 345 in the truth table 313. This is based on reading the reliable state as state 00 (state "6" of the third column) of the second memory cell 301-2 (D) for the proximity of the sensing voltage 311-3 (D VDM3N) in sensing window 312-3 being closer to the fourth threshold voltage distribution of 309-4 in memory cell 301-2. As a result, the first memory cell 301-1 (D*) is reflected in the fourth column (under the "Fail") of row 345 as the cell that has switched state (e.g., "flipped") and can be reprogrammed back to a correct programmed state in threshold voltage distribution 308-3 having the data value 01. An inverse pair of sensed states having a data value of 10, for memory cell 301-2 and threshold voltage distribution 308-1, having a data value of 00, for memory cell 301-1 is also a less readably reliable combination, as shown in row 337 in the truth table 313. This combination too, based on the sensing voltage methodology described herein, is a less readably reliable combination, expressed as state "2" as shown in row 337 in the truth table 313. This is based on reading the reliable state as state 00 (state "2" of the third column) of the first memory cell 301-1 (D*) for the proximity of the sensing voltage 310-3 (D*VDM3N) in sensing window 312-3 being closer to the fourth threshold voltage distribution of 308-4 in memory cell 301-1. As a result, the second memory cell 301-2 (D) is reflected in the fourth column (under the "Fail") as the cell that has switched state (e.g., "flipped") and can be reprogrammed back to a correct programmed state in threshold voltage distribution 309-3 having the data value 01 since the sensing voltage D VDM3N is in closer proximity on the end of sensing window 312-3.

Another example of a less readably reliable may include the combination of sensed data value of 01, for memory cell 301-2 and sensed data value of 01, for memory cell 301-1 is a less readably reliable combination, as shown in row 335 in the truth table 313. This combination, based on the sensing voltage methodology described herein is a less readably reliable combination, expressed as state "1" as shown in row 335 in the truth table 313. This is based on reading the reliable state as state 01 (state "1" of the third column) of the first memory cell 301-1 (D*) due to the proximity of the sensing voltage 310-3 (D*VDM3N) in sensing window 312-3 being closer to the fourth threshold voltage distribution of 308-3 in memory cell 301-1. As a result, the second memory cell 301-2 (D) is reflected in the fourth column (under the "Fail") as the cell that has switched state (e.g., "flipped") and can be reprogrammed back to a correct programmed state in threshold voltage distribution 309-4 having the data value 00 since the sensing voltage D VDM3N is in closer proximity on the end of sensing window 312-3.

Pairing the combination of sensed data value 00, for memory cell 301-2 and sensed data value 01, for memory cell 301-1 is a more readably reliable combination, as shown in row 331 in the truth table 313. The proximity of sensing voltage 310-3 (D*VDM1N) to threshold voltage distribution 308-3 for memory cell 301-1 in sensing window 312-3 and the proximity of sensing voltage 311-3 (D VDM3N) to threshold voltage distribution 309-4 for memory cell 301-2 in sensing window 312-3 produces the high likelihood of a valid state read. Similarly, sensed data values according to this disclosed methodology having a data value of 01 for memory cell 301-2 and having a data value of 00 for memory cell 301-1 is also a more readably reliable combination, as shown in row 331 (state "2") in the truth table 313 (N.A. listed under the fourth, "Fail" column representing a valid state).

Pairing the combination of sensed data value 00, for memory cell 301-2 and sensed data value 00, for memory cell 301-1 is a less readably reliable combination, as shown in row 336 in the truth table 313. This combination as well, based on the sensing voltage methodology described herein is a less readably reliable combination, expressed as state "1" as shown in row 336 in the truth table 313. This is based on reading the reliable state as state 00 (state "1" of the third column) of the second memory cell 301-2 (D) for the proximity of the sensing voltage 311-3 (D VDM3N) in sensing window 312-3 being closer to the fourth threshold voltage distribution of 309-4 in memory cell 301-2. As a result, the first memory cell 301-1 (D*) is reflected in the fourth column (under the "Fail") of row 336 as the cell that has switched state (e.g., "flipped") and can be reprogrammed back to a correct programmed state in threshold voltage distribution 308-3 having the data value 01.

As such, the truth table 313 may be used to enable determining which of the two memory cells has switched their memory state due to a shift in its threshold voltage distribution relative to a magnitude of a corresponding sensing voltage. The determination may be based on comparing a pair of data values determined to be reliable for the first and second memory cells to a sensed second data value pair of the first and second memory cells. The determination may be further based on determining which of the two memory cells has switched their memory state based on which memory cell has a sensed memory state that differs from the first data value pair for the first and second memory cells.

Although, truth table 313 is described based on a negative polarity, embodiments are not so limited. Truth table 313 may be similarly read in a positive polarity to that described above in association with the negative polarity operation.

Figure 4:
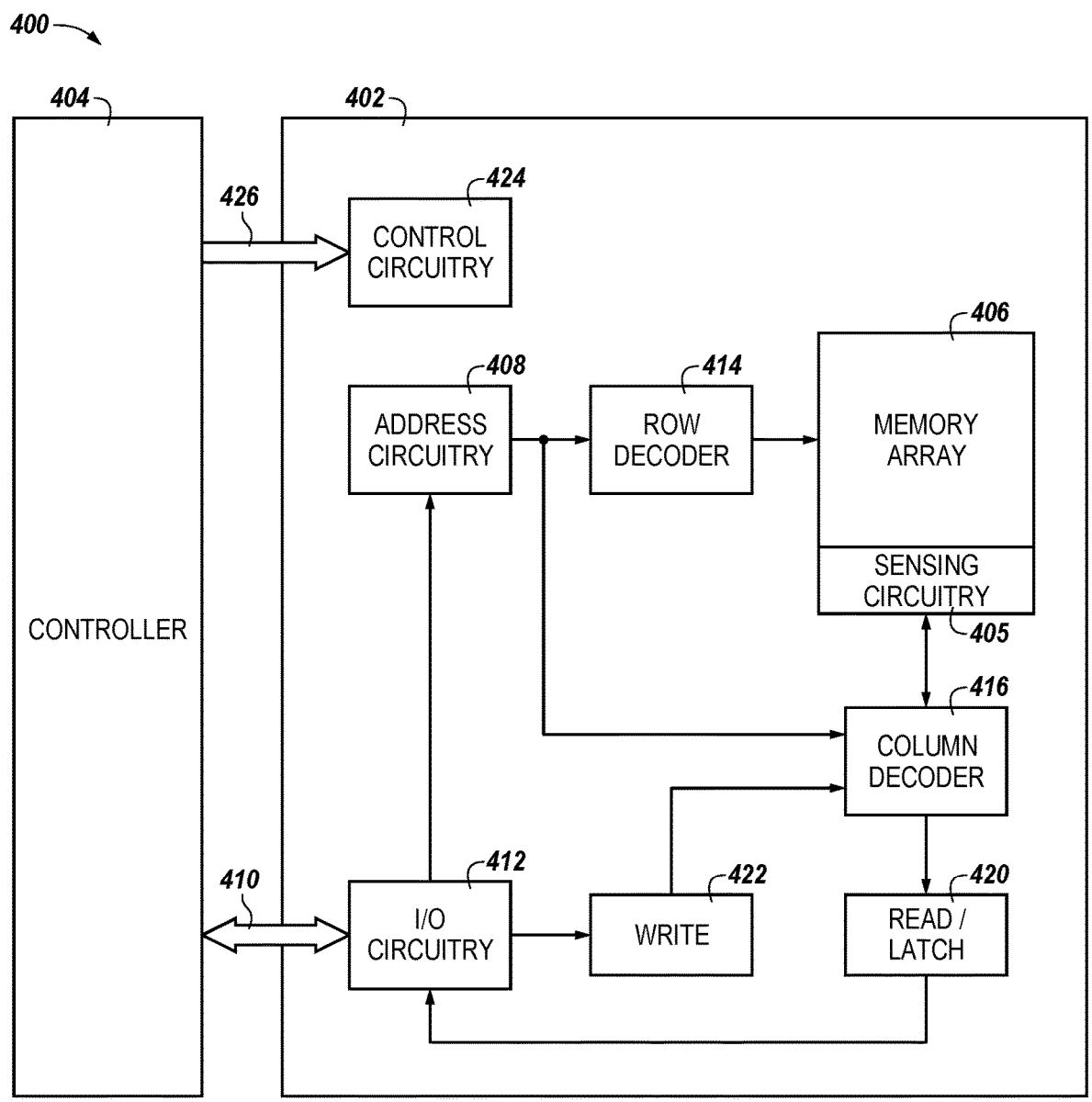
FIG. 4 is a block diagram illustration of an example apparatus, in accordance with an embodiment of the present disclosure.

FIG. 4 is a block diagram illustration of an example apparatus, such as an electronic memory system 400, in accordance with an embodiment of the present disclosure. Memory system 400 may include an apparatus, such as a memory device 402 and a controller 404, such as a memory controller (e.g., a host controller). Controller 404 might include a processor, for example. Controller 404 might be coupled to a host, for example, and may receive command signals (or commands), address signals (or addresses), and data signals (or data) from the host and may output data to the host.

Memory device 402 includes a memory array 406 of memory cells. For example, memory array 406 may include one or more of the memory arrays, such as a cross-point array, of memory cells disclosed herein. Memory device 402 may include address circuitry 408 to latch address signals provided over I/O connections 410 through I/O circuitry 412. Address signals may be received and decoded by a row decoder 414 and a column decoder 416 to access the memory array 406. For example, row decoder 414 and/or column decoder 416 may include drivers.

Memory device 402 may sense (e.g., read) data in memory array 406 by sensing voltage and/or current changes in the memory array columns using sense/buffer circuitry that in some examples may be read/latch circuitry 420. Read/latch circuitry 420 may read and latch data from the memory array 406. Sensing circuitry 405 may include a number of sense amplifiers coupled to memory cells of memory array 406, which may operate in combination with the read/latch circuitry 420 to sense (read) memory states from targeted memory cells. I/O circuitry 412 may be included for bi-directional data communication over the I/O connections 410 with controller 404. Write circuitry 422 may be included to write data to memory array 406.

Control circuitry 424 may decode signals provided by control connections 426 from controller 404. These signals may include chip signals, write enable signals, and address latch signals that are used to control the operations on memory array 406, including data read and data write operations.

Control circuitry 424 may be included in controller 404, for example. Controller 404 may include other circuitry, firmware, software, or the like, whether alone or in combination. Controller 404 may be an external controller (e.g., in a separate die from the memory array 406, whether wholly or in part) or an internal controller (e.g., included in a same die as the memory array 406). For example, an internal controller might be a state machine or a memory sequencer.

In some examples, controller 404 may be configured to cause memory device 402 to at least perform the methods disclosed herein, such as two multi-level memory cells being sensed to determine multiple data values. In some examples, memory device 402 may include the circuitry previously described in conjunction with FIGS. 1, 2A-B, and 3A-B. For example, memory device 402 may include circuitry such as the sense amplifiers, the latches, the truth tables, the word and bit lines, and/or the paired memory cells, among other circuitry disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 400 of FIG. 4 has been simplified. It should be recognized that the functionality of the various block components described with reference to FIG. 4 may not necessarily be segregated to distinct components or component portions of an integrated circuit device. For example, a single component or component portion of an integrated circuit device could be adapted to perform the functionality of more than one block component of FIG. 4. Alternatively, one or more components or component portions of an integrated circuit device could be combined to perform the functionality of a single block component of FIG. 4.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells; and
circuitry configured to sense memory states of each of two self-selecting multi-level memory cells (MLC) of the plurality of memory cells to determine multiple data values by:
sensing a memory state of a first MLC using a first sensing voltage in a sense window between a first threshold voltage distribution corresponding to a first memory state and a second threshold voltage distribution corresponding to a second memory state;
sensing a memory state of a second MLC using a second sensing voltage in a sense window between a first threshold voltage distribution corresponding to a first memory state and a second threshold voltage distribution corresponding to a second memory state;
sensing the memory state of the first and the second MLCs using sensing voltages higher, in absolute magnitude values, than the first and the second sensing voltages in subsequent sensing windows, in repeated iterations, until the state of the first and the second MLCs are determined; and
wherein the first sensing voltage and the second sensing voltage are selectably closer in the sense window to the first threshold voltage distribution or the second threshold voltage distribution.

2. The apparatus of claim 1, wherein the circuitry determines data values by:
sensing a memory state of the first MLC using a third sensing voltage in a sense window between the second threshold voltage distribution corresponding to the second memory state and a third threshold voltage distribution corresponding to a third memory state;
sensing the memory state of the second MLC using a fourth sensing voltage in the sense window between the second threshold voltage distribution corresponding to the second memory state and a third threshold voltage distribution corresponding to the third memory state; and
wherein the third sensing voltage and the fourth sensing voltage are selectably closer in the sense window to the second threshold voltage distribution or the third threshold voltage distribution.

3. The apparatus of claim 1, wherein the circuitry determines data values by:
sensing a memory state of the first MLC using a fifth sensing voltage in a sense window between the third threshold voltage distribution corresponding to the third memory state and a fourth threshold voltage distribution corresponding to a fourth memory state;
sensing a memory state of the second MLC using a sixth sensing voltage in the sense window between the third threshold voltage distribution corresponding to the third memory state and a fourth threshold voltage distribution corresponding to the fourth memory state; and
wherein the fifth sensing voltage and the sixth sensing voltage are selectably closer in the sense window to the third threshold voltage distribution or the fourth threshold voltage distribution.

4. The apparatus of claim 1, wherein the first and second MLCs each comprise 2 bits and provide a combination of 4 memory states.

5. The apparatus of claim 1, wherein the first sensing voltage is lower than the second sensing voltage.

6. The apparatus of claim 3, wherein a sensing voltage determines a reliability of a threshold voltage distribution.

7. An apparatus, comprising:
circuitry in a memory device, the circuitry configured to:
sense memory states of each of two self-selecting multi-level memory cells (MLCs) of a plurality of memory cells to determine multiple data values by:
sensing a memory state of a first MLC using a first sensing voltage in a sense window between a first threshold voltage distribution corresponding to a first memory state and a second threshold voltage distribution corresponding to a second memory state;
sensing a memory state of a second MLC using a second sensing voltage in a sense window between the first threshold voltage distribution corresponding to a first memory state and a second threshold voltage distribution corresponding to the second memory state;
sensing the memory state of the first and the second MLCs using higher sensing voltages than the first and the second sensing voltages in subsequent sensing windows, in repeated iterations, until the state of the first and the second MLCs are determined; and
determining which of the two memory cells has switched their memory states due to a shift in the first threshold voltage distribution relative to a magnitude of the first sensing voltage in the sense window;
wherein the magnitude of the first sensing voltage is selectably closer to the first threshold voltage distribution than to the second threshold voltage distribution in the sense window.

8. The apparatus of claim 7, wherein each self-selecting memory cell comprise a single chalcogenide material which serves as a select element and a storage element.

9. The apparatus of claim 7, wherein the combination of a first memory cell in the MLC located at a highest voltage of the negative polarity and a second memory cell in the MLC located at a lowest voltage of the positive polarity do not switch memory states.

10. The apparatus of claim 7, wherein the value of the memory state is determined before switching from the first threshold voltage to a second threshold voltage.

11. The apparatus of claim 7, wherein the first sensing voltage is closer to the first threshold voltage distribution and the second sensing voltage is closer to the second threshold voltage distribution in the sense window.

12. The apparatus of claim 7, wherein a first sensing voltage and the second sensing voltage are selectably closer in the sense window to different ones of the first threshold voltage distribution and the second sensing voltage.

13. The apparatus of claim 7, wherein a position of the first sensing voltage and the second sensing voltage are fixed.

14. The apparatus of claim 7, wherein the MLCs are programmed in a negative polarity for a negative read using one of a pair of complementary memory states for the first memory cell and a positive polarity for a positive read using another of the pair for the second memory cell.

15. The apparatus of claim 7, wherein the circuitry is further configured to program the data values by:
applying a first voltage pulse to the first memory cell, wherein the first memory cell is designated to store its data values; and applying a second voltage pulse to the second memory cell, wherein the second memory cell is designated to store its data values as a comparison for the first memory cell data values to find which memory cell switched its memory state.

16. The apparatus of claim 7, wherein each of the two memory cells is a resistance variable memory cell configured to selectably store either of the first and second states.

17. A method of operating memory, comprising:
sensing memory states of two multi-level memory cells (MLCs) of a plurality of memory cells to determine four data values and sixteen combinations by:
sensing a memory state of a first MLC using a first sensing voltage in a sense window between a first threshold voltage distribution corresponding to a first memory state and a second threshold voltage distribution corresponding to a second memory state;
sensing a memory state of a second MLC using a second sensing voltage in a sense window between the first threshold voltage distribution corresponding to a first memory state and a second threshold voltage distribution corresponding to the second memory state;
sensing the memory state of the first and the second MLCs using higher sensing voltages than the first and the second sensing voltages in subsequent sensing windows, in repeated iterations, until the state of the first and the second MLCs are determined; and
selectably positioning the first sensing voltage and the second sensing voltage closer in the sense window to the first threshold voltage distribution or the second threshold voltage distribution.

18. The method of claim 17, further comprising:
comparing the sensed memory states of each of the two memory cells;
validating the memory state of the first memory cell as an intended data value corresponding to the four data values by determining that the sensed memory states are complementary binary memory states; and
determining a switch in the memory state of the two MLCs by determining that the sensed memory states match binary memory states.

19. The method of claim 17, further comprising reading the data values within the two MLCs as a unit.

20. The method of claim 17, further comprising switching memory states due to a shift in the second threshold voltage distribution relative to a magnitude of the second sensing voltage in the sense window.

* * * * *